(12) United States Patent
Holliday

(10) Patent No.: US 9,639,981 B1
(45) Date of Patent: May 2, 2017

(54) TETRAHEDRAL SHELL GENERATION

(75) Inventor: Taylor Holliday, Sacramento, CA (US)

(73) Assignee: PIXAR, Emeryville, CA (US)

( * ) Notice: Subject to any disclaimer, the term of this patent is extended or adjusted under 35 U.S.C. 154(b) by 824 days.

(21) Appl. No.: 13/533,737

(22) Filed: Jun. 26, 2012

(51) Int. Cl.
*G06T 17/20* (2006.01)
*G06T 17/10* (2006.01)
*G06F 17/50* (2006.01)

(52) U.S. Cl.
CPC .......... *G06T 17/20* (2013.01); *G06F 17/5018* (2013.01); *G06T 17/10* (2013.01)

(58) Field of Classification Search
CPC ...... G06T 13/20; G06T 13/07; G06T 13/0083
USPC .................................................. 345/419, 420
See application file for complete search history.

(56) References Cited

U.S. PATENT DOCUMENTS

| | | | | |
|---|---|---|---|---|
| 5,798,764 | A * | 8/1998 | Akiyama ...................... | 345/423 |
| 7,286,127 | B2 * | 10/2007 | Zhou et al. .................. | 345/420 |
| 7,868,885 | B2 * | 1/2011 | Zhou et al. .................. | 345/419 |

OTHER PUBLICATIONS

Porumbescu, S. D., Budge, B., Feng, L., & Joy, K. I. (2005). Shell maps. ACM Transactions on Graphics (TOG), 24(3), 626-633.*
Porumbescu, S. D. et al., "Shell Maps", ACM Transactions on Graphics (TOG), Proceedings of ACM SIGGRAPH 2005, vol. 24, Issue 3, Jul. 2005, pp. 626-633.

* cited by examiner

*Primary Examiner* — Vu Nguyen
(74) *Attorney, Agent, or Firm* — Kilpatrick Townsend & Stockton LLP

(57) ABSTRACT

Tetrahedra can be used as primitives to represent volumetric shells because of their ease of performing geometric tests such as intersection with other geometric primitives. Each triangular face of a triangulated surface mesh can be extruded or otherwise formed into a prism, and that prism can be filled with tets (tetrahedra). An edge of a tet can be deemed to be rising if, going counterlockwise around the face, the corresponding tet-edge that splits the extruded face proceeds from the inset surface to the offset surface. To determine a valid tet orientation, each directed edge of the surface mesh is labeled as Rising or Falling (R, F). In various embodiments, one or more simple rules are used for determining whether an edge is rising or falling. In one aspect, a partial ordering of the connectivity of a surface is used in the tet generation process.

21 Claims, 5 Drawing Sheets

TETRAHEDRAL SHELL GENERATION

BACKGROUND

This disclosure relates to computer-generated imagery (CGI) and computer-aided animation. More specifically, this disclosure relates to techniques for tetrahedral shell generation for use in CGI and computer-aided animation.

With the wide-spread availability of computers, computer graphics artists and animators can rely upon computers to assist in production process for creating animations and computer-generated imagery (CGI). This may include using computers to have physical models be represented by virtual models in computer memory. Typically, two-dimensional (2D) or three-dimensional (3D) computer-aided animation combines 2D/3D models of objects and programmed movement of one or more of the models. In 3D computer animation, the first step is typically the object modeling process. Objects can be sculpted much like real clay or plaster, working from general forms to specific details, for example, with various sculpting tools. Models may then be constructed, for example, out of geometrical vertices, faces, and edges in a 3D coordinate system to represent the objects. These virtual models can then be manipulated using computers to, for example, simulate physics, design aesthetic actions such as poses or other deformations, crate lighting, coloring and paint, or the like, of characters or other elements of a computer animation display.

Pixar is one of the pioneering companies in the computer-generated imagery (CGI) and computer-aided animation industry. Pixar is more widely known as Pixar Animation Studios, the creators of animated features such as "Toy Story" (1995) and "Toy Story 2" (1999), "A Bugs Life" (1998), "Monsters, Inc." (2001), "Finding Nemo" (2003), "The Incredibles" (2004), "Cars" (2006), "Ratatouille" (2007), and others. In addition to creating animated features, Pixar develops computing platforms and tools specially designed for computer-aided animation and CGI. One such example is now known as PhotoRealistic RenderMan, or PRMan for short. PRMan is a photorealistic RenderMan-compliant rendering software system based on the RenderMan Interface Specification (RISpec) which is Pixar's technical specification for a standard communications protocol (or interface) between 3D computer graphics programs and rendering programs. PRMan is produced by Pixar and used to render their in-house 3D animated movie productions. It is also available as a commercial product licensed to third parties, sold as part of a bundle called RenderMan Pro Server, a RenderMan-compliant rendering software system developed by Pixar based on their own interface specification. Other examples include tools and plug-ins for programs such as the AUTODESK MAYA high-end 3D computer graphics software package from AutoDesk, Inc. of San Rafael, Calif.

One core functional aspect of PRMan can include the use of a "rendering engine" to convert geometric and/or mathematical descriptions of objects into images. This process is known in the industry as "rendering." For movies, other animated features, shorts, and special effects, a user (e.g., a skilled computer graphics artist) can specify the geometric or mathematical description of objects to be used in the rendered image or animation sequence, such as characters, props, background, or the like. In some instances, the geometric description of the objects may include a number of animation control variables (avars) and values for the avars. An animator may also pose the objects within the image or sequence and specify motions and positions of the objects over time to create an animation.

As such, the production of CGI and computer-aided animation may involve the extensive use of various computer graphics techniques to produce a visually appealing image from the geometric description of an object that may be used to convey an essential element of a story or provide a desired special effect. One of the challenges in creating these visually appealing images can be the balancing of a desire for a highly-detailed image of a character or other object with the practical issues involved in allocating the resources (both human and computational) required to produce those visually appealing images.

Efficient collision detection is a fundamental problem in physically-based simulation and in computer animation. In order to accelerate collision detection for rigid bodies, many approaches based on pre-computed bounding-volume hierarchies have been proposed. However, in cases of deformable objects, these hierarchical data structures cannot be pre-computed, but have to be updated frequently. Although effort has been spent to optimize this update, it is still expensive in case of dynamic environments.

Although not necessarily confined to triangular meshes, generating a water-tight shell volume around a surface is necessary for certain types of collision detection. Tetrahedra are good primitives to represent this volume because of their ease of performing geometric tests such as intersection with other geometric primitives.

Typically, each triangular face of a triangulated surface mesh is extruded into a prism. That prism is then filled with tetraheda (tets). At minimum, there are 3 tets required to fill each prism. To ensure the surface is water-tight (no gaps between prisms), adjacent prism faces (quads) must be split into two tet-faces such that the tet-faces match up.

Accordingly, what is desired is to solve one or more of the problems relating to tetrahedral shell generation for use in CGI and computer-aided animation, some of which may be discussed herein. Additionally, what is desired is to reduce some of the drawbacks relating to tetrahedral shell generation for use in CGI and computer-aided animation, some of which may be discussed herein.

BRIEF SUMMARY

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

Tetrahedra can be used as primitives to represent volumetric shells because of their ease of performing geometric tests such as intersection with other geometric primitives. Each triangular face of a triangulated surface mesh can be extruded or otherwise formed into a prism, and that prism can be filled with tets (tetrahedra). In some aspects, to ensure the surface is water-tight (no gaps between prisms), adjacent prism faces (quads) are split into two tet-faces such that the tet-faces match up.

An edge of a tet can be deemed to be rising if, going counterlockwise around the face, the corresponding tet-edge that splits the extruded face proceeds from the inset surface to the offset surface. To determine a valid tet orientation, each directed edge of the surface mesh (there are two directed edges per non-boundary edge) is labeled as Rising or Falling (R, F). In various embodiments, one or more simple rules are used for determining whether an edge is rising or falling. In one aspect, a partial ordering of the connectivity of a surface is used in the tet generation process.

In one embodiment, a method for generating an offset volume includes receiving, at one or more computer systems, information specifying a surface. Information specifying a second surface having at least the same connectivity as the first surface is also received. A set of elements of the first surface are then classified into at least a partial ordering. A plurality of tetrahedra for a volume created by the first surface and the second surface are then generated based on the partial ordering of the elements of the first surface. Information describing a tetrahedral shell associated with the first and second surface can be generated or stored for use in collisions or intersection testing.

In one aspect, classifying, with the one or more processors associated with the one or more computer systems, the set of elements of the first surface into at least the partial ordering includes determining an index of each vertex in a set of vertices associated with the first surface. In another aspect, classifying, with the one or more processors associated with the one or more computer systems, the set of elements of the first surface into at least the partial ordering includes ordering each vertex in a set of vertices associated with the first surface based on a set of coordinates.

In some embodiments, generating, with the one or more processors associated with the one or more computer systems, the plurality of tetrahedra for the volume includes determining rising and falling edges of a tetrahedra in response to the partial ordering. A rising edge can be determined based on a rule indicating that rising edges originate from a first location that is classified before a second location at which the rising edges end. A falling edge can be determined based on a rule indicating that falling edges originate at a first location that is classified before a second location at which the falling edges end.

In further embodiments, a non-transitory computer-readable medium storing computer-executable code for generating an offset volume includes code for receiving information specifying a surface, code for receiving information specifying a second surface having at least the same connectivity as the first surface, code for classifying a set of elements of the first surface into at least a partial ordering, and code for generating a plurality of tetrahedra for a volume created by the first surface and the second surface based on the partial ordering of the elements of the first surface.

In one embodiment, system for generating an offset volume includes a processor and a memory configured to store a set of instructions which when executed by the processor cause the processor to receive information specifying a surface, receive information specifying a second surface having at least the same connectivity as the first surface, classify a set of elements of the first surface into at least a partial ordering, and generate a plurality of tetrahedra for a volume created by the first surface and the second surface based on the partial ordering of the elements of the first surface.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION

Figure 1:
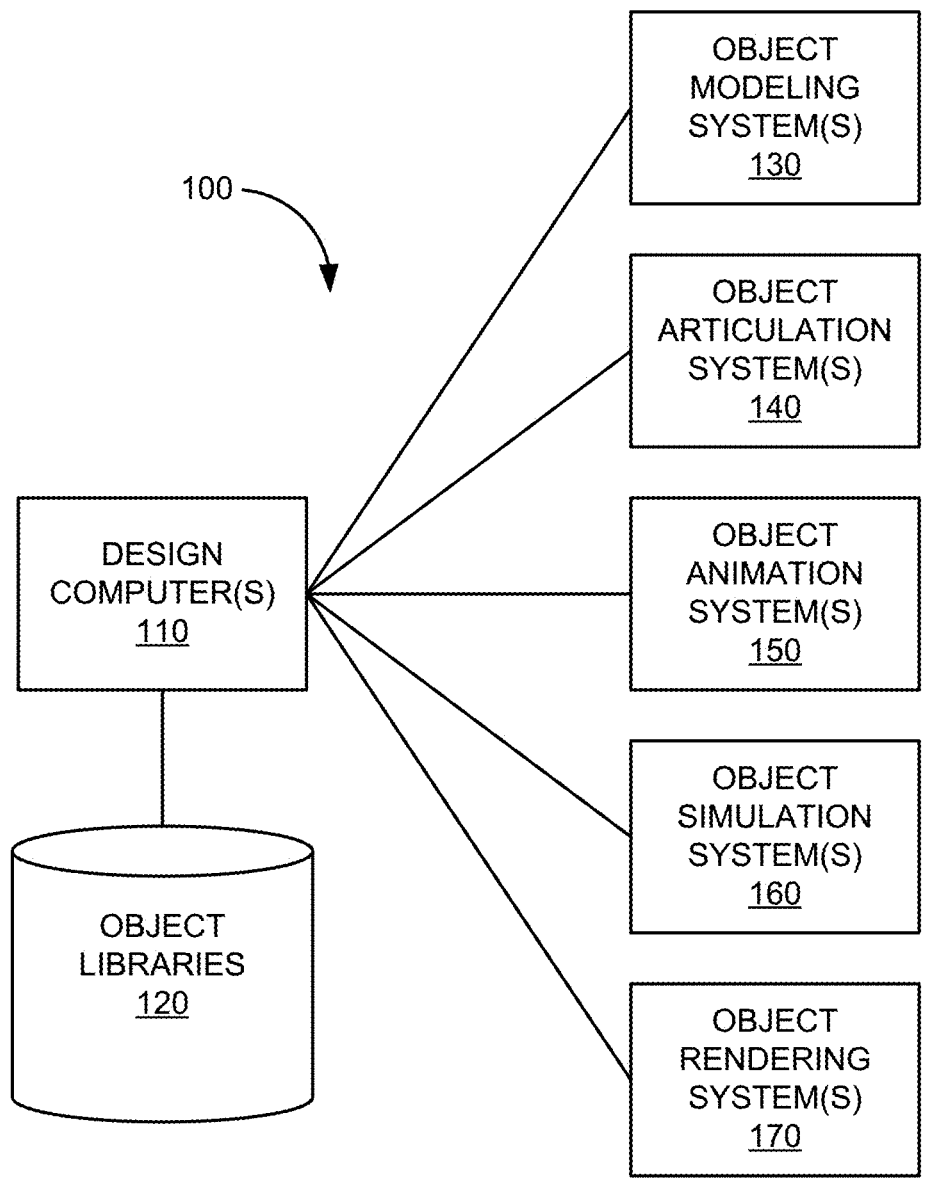
FIG. 1 is a simplified block diagram of a system for creating computer graphics imagery (CGI) and computer-aided animation that may implement or incorporate various embodiments or techniques for tetrahedral shell generation.

FIG. 1 is a simplified block diagram of system 100 for creating computer graphics imagery (CGI) and computer-aided animation that may implement or incorporate various embodiments or techniques for tetrahedral shell generation. In this example, system 100 can include one or more design computers 110, object library 120, one or more object modeler systems 130, one or more object articulation systems 140, one or more object animation systems 150, one or more object simulation systems 160, and one or more object rendering systems 170.

The one or more design computers 110 can include hardware and software elements configured for designing CGI and assisting with computer-aided animation. Each of the one or more design computers 110 may be embodied as a single computing device or a set of one or more computing devices. Some examples of computing devices are PCs, laptops, workstations, mainframes, cluster computing system, grid computing systems, cloud computing systems, embedded devices, computer graphics devices, gaming devices and consoles, consumer electronic devices having programmable processors, or the like. The one or more design computers 110 may be used at various stages of a production process (e.g., pre-production, designing, creating, editing, simulating, animating, rendering, post-production, etc.) to produce images, image sequences, motion pictures, video, audio, or associated effects related to CGI and animation.

In one example, a user of the one or more design computers 110 acting as a modeler may employ one or more systems or tools to design, create, or modify objects within a computer-generated scene. The modeler may use modeling software to sculpt and refine a neutral 3D model to fit predefined aesthetic needs of one or more character designers. The modeler may design and maintain a modeling topology conducive to a storyboarded range of deformations. In another example, a user of the one or more design computers 110 acting as an articulator may employ one or more systems or tools to design, create, or modify controls or animation variables (avars) of models. In general, rigging is a process of giving an object, such as a character model, controls for movement, therein "articulating" its ranges of motion. The articulator may work closely with one or more animators in rig building to provide and refine an articulation of the full range of expressions and body movement needed to support a character's acting range in an animation. In a further example, a user of design computer 110 acting as an animator may employ one or more systems or tools to specify motion and position of one or more objects over time to produce an animation.

Object library 120 can include hardware and/or software elements configured for storing and accessing information related to objects used by the one or more design computers 110 during the various stages of a production process to produce CGI and animation. Some examples of object library 120 can include a file, a database, or other storage devices and mechanisms. Object library 120 may be locally accessible to the one or more design computers 110 or hosted by one or more external computer systems.

Some examples of information stored in object library 120 can include an object itself, metadata, object geometry, object topology, rigging, control data, animation data, animation cues, simulation data, texture data, lighting data, shader code, or the like. An object stored in object library 120 can include any entity that has an n-dimensional (e.g., 2D or 3D) surface geometry. The shape of the object can include a set of points or locations in space (e.g., object space) that make up the object's surface. Topology of an object can include the connectivity of the surface of the object (e.g., the genus or number of holes in an object) or the vertex/edge/face connectivity of an object.

The one or more object modeling systems 130 can include hardware and/or software elements configured for modeling one or more computer-generated objects. Modeling can include the creating, sculpting, and editing of an object. The one or more object modeling systems 130 may be invoked by or used directly by a user of the one or more design computers 110 and/or automatically invoked by or used by one or more processes associated with the one or more design computers 110. Some examples of software programs embodied as the one or more object modeling systems 130 can include commercially available high-end 3D computer graphics and 3D modeling software packages 3D STUDIO MAX and AUTODESK MAYA produced by Autodesk, Inc. of San Rafael, Calif.

In various embodiments, the one or more object modeling systems 130 may be configured to generated a model to include a description of the shape of an object. The one or more object modeling systems 130 can be configured to facilitate the creation and/or editing of features, such as non-uniform rational B-splines or NURBS, polygons and subdivision surfaces (or SubDivs), that may be used to describe the shape of an object. In general, polygons are a widely used model medium due to their relative stability and functionality. Polygons can also act as the bridge between NURBS and SubDivs. NURBS are used mainly for their ready-smooth appearance and generally respond well to deformations. SubDivs are a combination of both NURBS and polygons representing a smooth surface via the specification of a coarser piecewise linear polygon mesh. A single object may have several different models that describe its shape.

The one or more object modeling systems 130 may further generate model data (e.g., 2D and 3D model data) for use by other elements of system 100 or that can be stored in object library 120. The one or more object modeling systems 130 may be configured to allow a user to associate additional information, metadata, color, lighting, rigging, controls, or the like, with all or a portion of the generated model data.

The one or more object articulation systems 140 can include hardware and/or software elements configured to articulating one or more computer-generated objects. Articulation can include the building or creation of rigs, the rigging of an object, and the editing of rigging. The one or more object articulation systems 140 may be invoked by or used directly by a user of the one or more design computers 110 and/or automatically invoked by or used by one or more processes associated with the one or more design computers 110. Some examples of software programs embodied as the one or more object articulation systems 140 can include commercially available high-end 3D computer graphics and 3D mode ling software packages 3D STUDIO MAX and AUTODESK MAYA produced by Autodesk, Inc. of San Rafael, Calif.

In various embodiments, the one or more articulation systems 140 can be configured to enable the specification of rigging for an object, such as for internal skeletal structures or eternal features, and to define how input motion deforms the object. One technique is called "skeletal animation," in which a character can be represented in at least two parts: a surface representation used to draw the character (called the skin) and a hierarchical set of bones used for animation (called the skeleton).

The one or more object articulation systems 140 may further generate articulation data (e.g., data associated with controls or animations variables) for use by other elements of system 100 or that can be stored in object library 120. The one or more object articulation systems 140 may be configured to allow a user to associate additional information, metadata, color, lighting, rigging, controls, or the like, with all or a portion of the generated articulation data.

The one or more object animation systems 150 can include hardware and/or software elements configured for animating one or more computer-generated objects. Animation can include the specification of motion and position of an object over time. The one or more object animation systems 150 may be invoked by or used directly by a user of the one or more design computers 110 and/or automatically invoked by or used by one or more processes associated with the one or more design computers 110. Some examples of software programs embodied as the one or more object animation systems 150 can include commercially available high-end 3D computer graphics and 3D modeling software packages 3D STUDIO MAX and AUTODESK MAYA produced by Autodesk, Inc. of San Rafael, Calif.

In various embodiments, the one or more animation systems 150 may be configured to enable users to manipulate controls or animation variables or utilized character rigging to specify one or more key frames of animation sequence. The one or more animation systems 150 generate intermediary frames based on the one or more key frames. In some embodiments, the one or more animation systems 150 may be configured to enable users to specify animation cues, paths, or the like according to one or more predefined sequences. The one or more animation systems 150 generate frames of the animation based on the animation cues or paths. In further embodiments, the one or more animation systems 150 may be configured to enable users to define animations using one or more animation languages, morphs, deformations, or the like.

The one or more object animations systems 150 may further generate animation data (e.g., inputs associated with controls or animations variables) for use by other elements of system 100 or that can be stored in object library 120. The one or more object animations systems 150 may be configured to allow a user to associate additional information, metadata, color, lighting, rigging, controls, or the like, with all or a portion of the generated animation data.

The one or more object simulation systems 160 can include hardware and/or software elements configured for simulating one or more computer-generated objects. Simulation can include determining motion and position of an object over time in response to one or more simulated forces or conditions. The one or more object simulation systems 160 may be invoked by or used directly by a user of the one or more design computers 110 and/or automatically invoked by or used by one or more processes associated with the one or more design computers 110. Some examples of software programs embodied as the one or more object simulation systems 160 can include commercially available high-end 3D computer graphics and 3D modeling software packages 3D STUDIO MAX and AUTODESK MAYA produced by Autodesk, Inc. of San Rafael, Calif.

In various embodiments, the one or more object simulation systems 160 may be configured to enables users to create, define, or edit simulation engines, such as a physics engine or physics processing unit (PPU/GPGPU) using one or more physically-based numerical techniques. In general, a physics engine can include a computer program that simulates one or more physics models (e.g., a Newtonian physics model), using variables such as mass, velocity, friction, wind resistance, or the like. The physics engine may simulate and predict effects under different conditions that would approximate what happens to an object according to the physics model. The one or more object simulation systems 160 may be used to simulate the behavior of objects, such as hair, fur, and cloth, in response to a physics model and/or animation of one or more characters and objects within a computer-generated scene.

The one or more object simulation systems 160 may further generate simulation data (e.g., motion and position of an object over time) for use by other elements of system 100 or that can be stored in object library 120. The generated simulation data may be combined with or used in addition to animation data generated by the one or more object animation systems 150. The one or more object simulation systems 160 may be configured to allow a user to associate additional information, metadata, color, lighting, rigging, controls, or the like, with all or a portion of the generated simulation data.

The one or more object rendering systems 170 can include hardware and/or software element configured for "rendering" or generating one or more images of one or more computer-generated objects. "Rendering" can include generating an image from a model based on information such as geometry, viewpoint, texture, lighting, and shading information. The one or more object rendering systems 170 may be invoked by or used directly by a user of the one or more design computers 110 and/or automatically invoked by or used by one or more processes associated with the one or more design computers 110. One example of a software program embodied as the one or more object rendering systems 170 can include PhotoRealistic RenderMan, or PRMan, produced by Pixar Animations Studios of Emeryville, Calif.

In various embodiments, the one or more object rendering systems 170 can be configured to render one or more objects to produce one or more computer-generated images or a set of images over time that provide an animation. The one or more object rendering systems 170 may generate digital images or raster graphics images.

In various embodiments, a rendered image can be understood in terms of a number of visible features. Some examples of visible features that may be considered by the one or more object rendering systems 170 may include shading (e.g., techniques relating to how the color and brightness of a surface varies with lighting), texture-mapping (e.g., techniques relating to applying detail information to surfaces or objects using maps), bump-mapping (e.g., techniques relating to simulating small-scale bumpiness on surfaces), fogging/participating medium (e.g., techniques relating to how light dims when passing through non-clear atmosphere or air) shadows (e.g., techniques relating to effects of obstructing light), soft shadows (e.g., techniques relating to varying darkness caused by partially obscured light sources), reflection (e.g., techniques relating to mirror-like or highly glossy reflection), transparency or opacity (e.g., techniques relating to sharp transmissions of light through solid objects), translucency (e.g., techniques relating to highly scattered transmissions of light through solid objects), refraction (e.g., techniques relating to bending of light associated with transparency), diffraction (e.g., techniques relating to bending, spreading and interference of light passing by an object or aperture that disrupts the ray), indirect illumination (e.g., techniques relating to surfaces illuminated by light reflected off other surfaces, rather than directly from a light source, also known as global illumination), caustics (e.g., a form of indirect illumination with techniques relating to reflections of light off a shiny object, or focusing of light through a transparent object, to produce bright highlights on another object), depth of field (e.g., techniques relating to how objects appear blurry or out of focus when too far in front of or behind the object in focus), motion blur (e.g., techniques relating to how objects appear blurry due to high-speed motion, or the motion of the camera), non-photorealistic rendering (e.g., techniques relating to rendering of scenes in an artistic style, intended to look like a painting or drawing), or the like.

The one or more object rendering systems 170 may further render images (e.g., motion and position of an object over time) for use by other elements of system 100 or that can be stored in object library 120. The one or more object rendering systems 170 may be configured to allow a user to associate additional information or metadata with all or a portion of the rendered image.

In various embodiments, system 100 may include one or more hardware elements and/or software elements, components, tools, or processes, embodied as the one or more design computers 110, object library 120, the one or more object modeler systems 130, the one or more object articulation systems 140, the one or more object animation systems 150, the one or more object simulation systems 160, and/or the one or more object rendering systems 170 that provide one or more tools for tetrahedral shell generation.

Tetrahedra can be used as primitives to represent volumetric shells because of their ease of performing geometric tests such as intersection with other geometric primitives. Porumbescu et al. in their SIGGRAPH 2005 paper entitled "Shell Maps" (which is hereby incorporate by reference for all purposes) extruded each triangular face of a triangulated surface mesh into a prism, and that prism is filled with tets (tetrahedra). At minimum in Porumbescu, there are 3 tets required to fill a prism. To ensure the surface is water-tight (no gaps between prisms), adjacent prism faces (quads) must be split into two tet-faces such that the tet-faces match up.

Porumbescu uses a notion of Rising and Falling edges to generate tets. An edge is rising if, going counterlockwise around the face, the corresponding tet-edge that splits the extruded face proceeds from the inset surface to the offset surface. To determine a valid tet orientation, each directed edge of the surface mesh (there are two directed edges per non-boundary edge) is labeled as Rising or Falling (R, F), such that
Rising(org,dst)⇔ (dst,org)
and for a triangular face, the configurations R,R,R and F,F,F (counter-clockwise about a face) are not allowed (they do not lead to valid tetrahedralizations).

Porumbescu proposes a flood-fill algorithm (without back-tracking) to determine the tet orientations. An initial triangle is seeded with a valid configuration and then valid configurations are chosen for adjacent triangles, recursively. However, this flood fill proposal does not converge on some collision meshes.

With full back-tracking, valid configurations can be generated but it can be costly and therefore does not lend itself to a production pipeline. Instead, in various embodiments, one or more simple rules are used for determining whether an edge is rising or falling. In one aspect, a partial ordering of the connectivity of a surface is used in the tet generation process.

Figure 2:
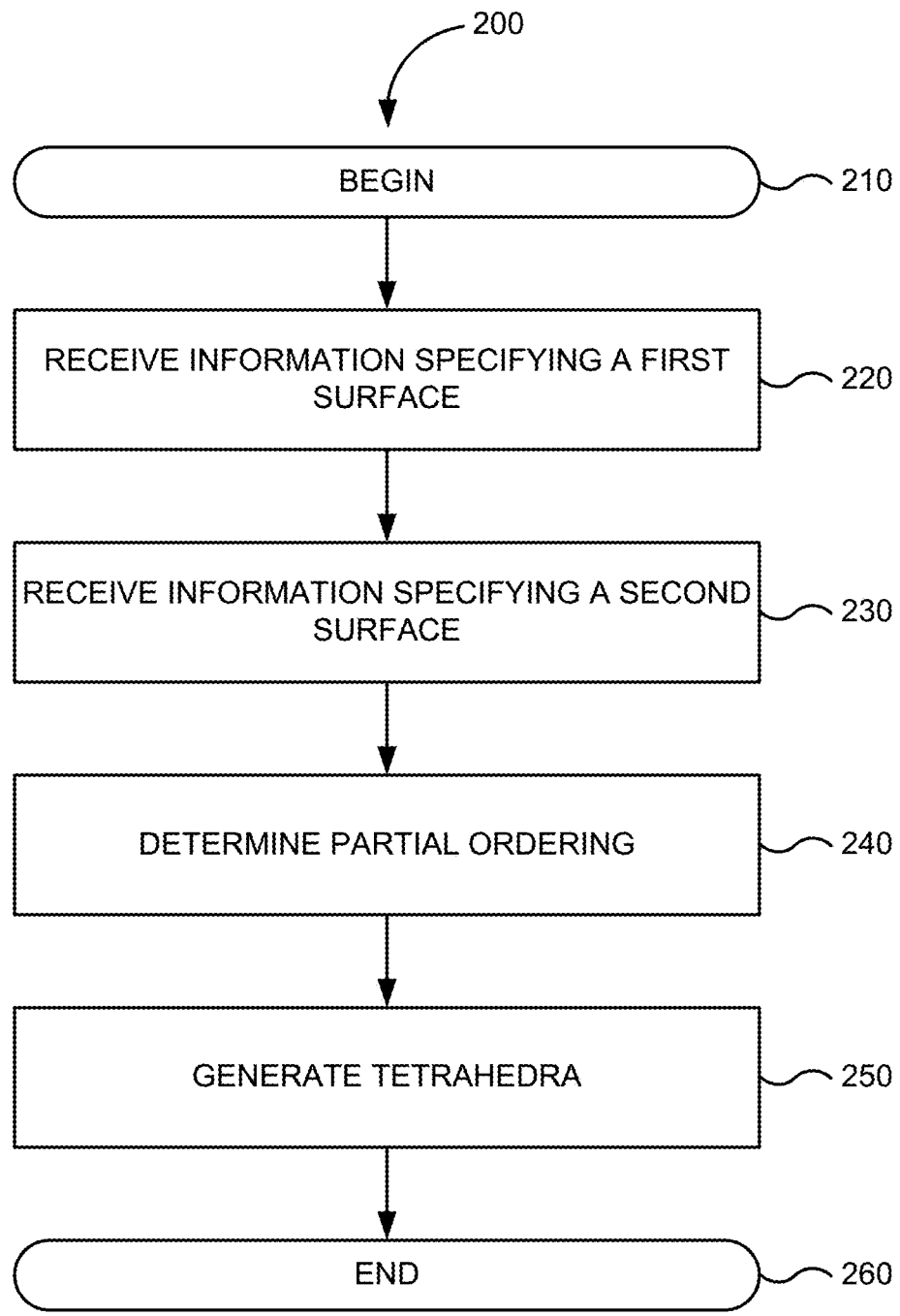
FIG. 2 is a flowchart of a method for generating tetrahedra in one embodiment.

FIG. 2 is a flowchart of method 200 for generating tetrahedra in one embodiment. Implementations of or processing in method 200 depicted in FIG. 2 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Method 200 depicted in FIG. 2 begins in step 210.

In step 220, information specifying a first surface is received. In step 230, information specifying a second surface is received. In one embodiment, the second surface has the same connectivity as the first surface. Connectivity may include the same number of vertices, edges, indexes, x-positions, angles, etc.

In step 240, a partial ordering is determined. For example, at least one or more vertices, edges, or other elements of the first surface or the second surface are ordered. Elements may be classified or ordered based on aspects of connectivity, such as index, x-position, angles, or other inherent or derived attributes. A complete ordering of the elements is not necessary when at least a partial ordering can act as a seed to give rise to rising and falling edges of tetrahedra.

In step 250, tetrahedra are generated based on the partial ordering. Method 200 ends in step 260.

Figure 3:
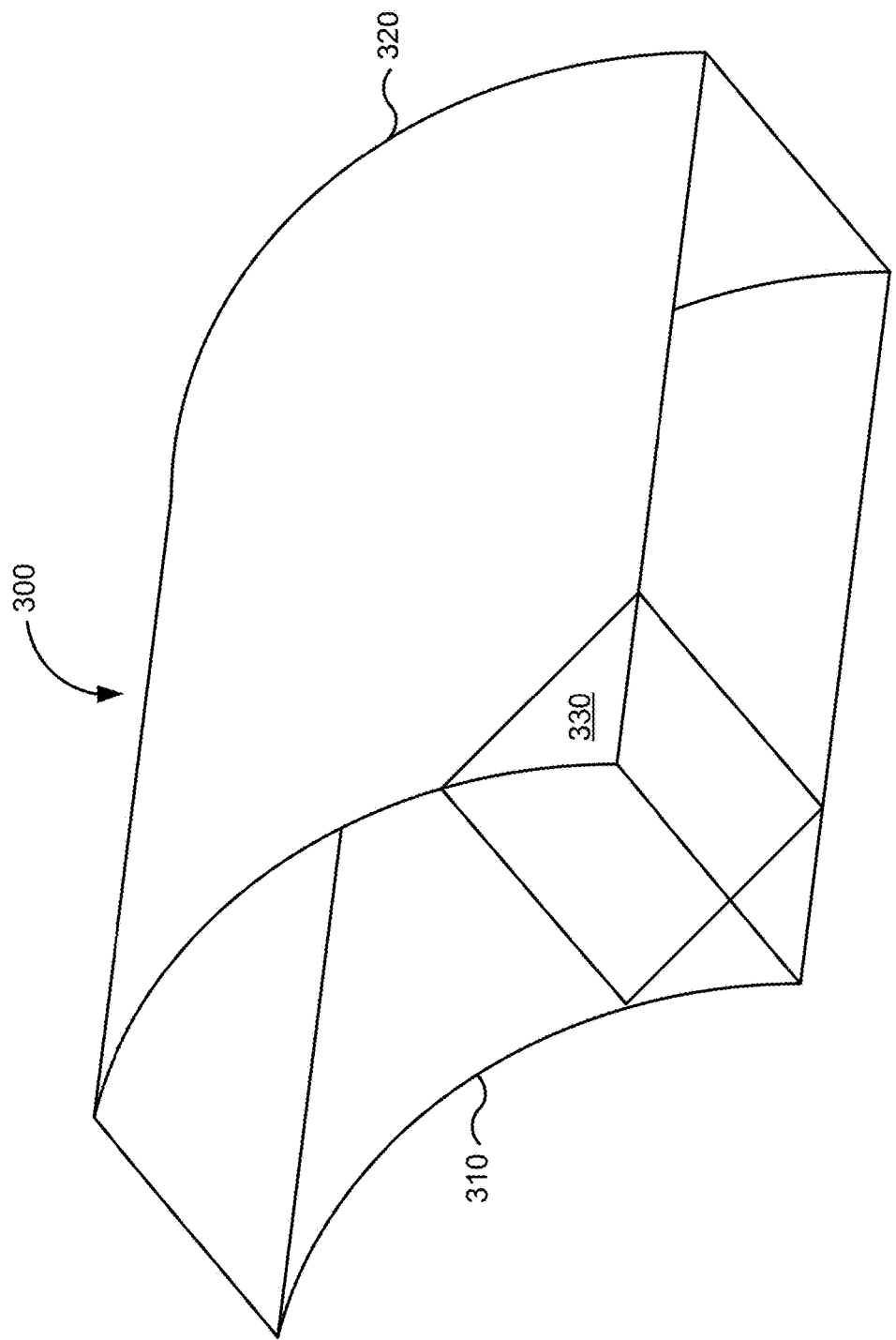
FIG. 3 is an illustration of an extruded volume in one embodiment.

FIG. 3 is an illustration of extruded volume 300 in one embodiment. In this example, surface 310 is offset or extruded to generate surface 320. Prism 330 is generated based on a geometric primitive of surface 310 and 320.

Figure 4:
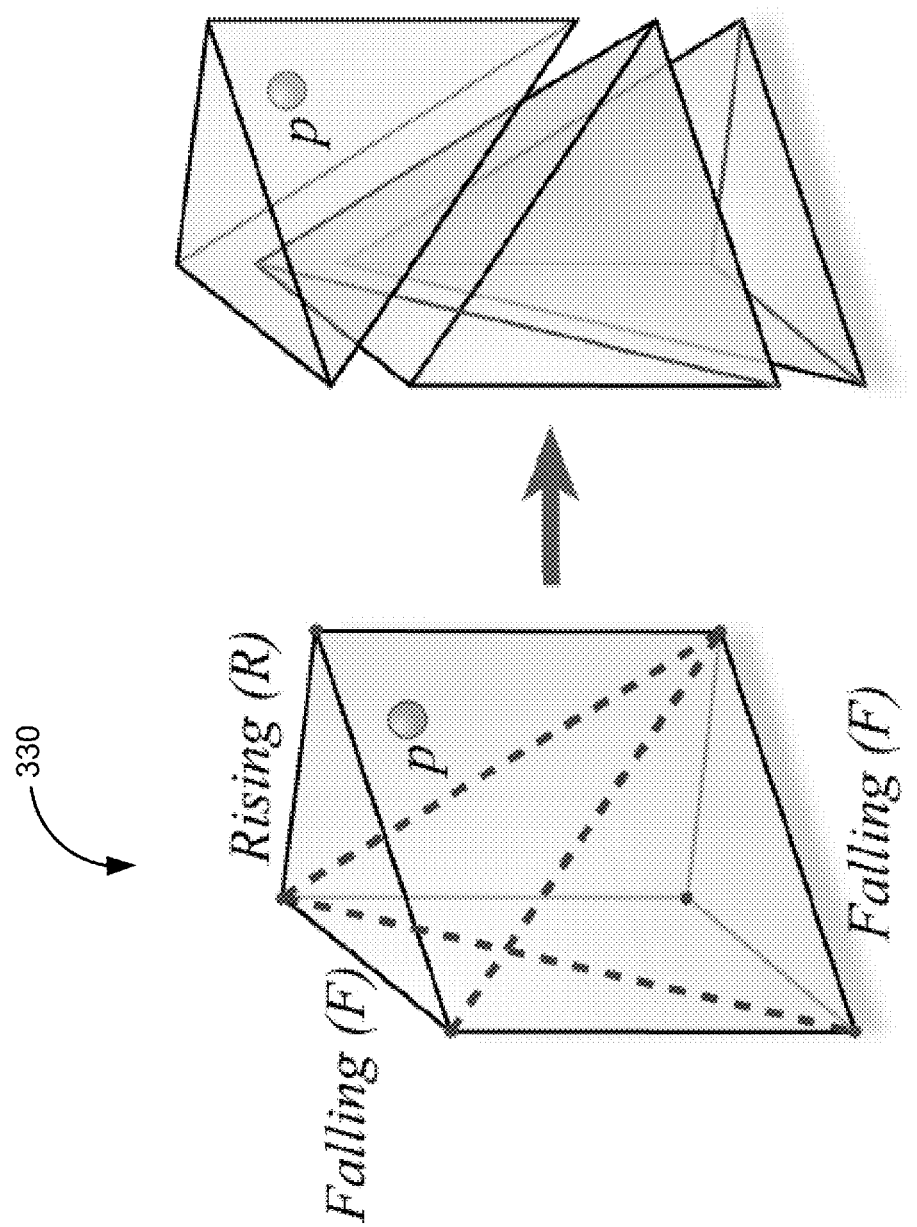
FIG. 4 is an illustration of classifying rising and falling edges in one embodiment.

FIG. 4 is an illustration of classifying rising and falling edges of prism 330 in one embodiment. For example, Let < be a partial order on vertices. Let
Rising(org,dst)⇔ org<dst
This satisfies the two conditions:
1. org<dst⇔ dst<org implies that Rising(org,dst)⇔ Falling (dst,org)
2. R,R,R and F,F,F are not generated because
Rising(a,b)∧ Rising(b,c)⇒ a<b<b ⇒ Falling(c,a)
and
Falling(a,b)∧ Falling(b,c)⇒ a<b<b ⇒ Rising(c,a)

The partial order, <, may be generated using unique vertex indices. Though to obtain a symmetric mesh (as is often desirable in animation), the absolute value of the x-coordinate may be used (with an appropriate tie-breaker that preserves symmetry).

In one aspect, this triangulation scheme can be used for a hair simulator. Of worth noting is that splitting the prisms such that each quad is triangulated the same way (and side-stepping the need for this rule) would require introducing a new vertex on each face, more than doubling the number of tets required and reducing performance considerably. Thus, the above provides a simple scheme for generating a tetrahedral shell around a surface.

Figure 5:
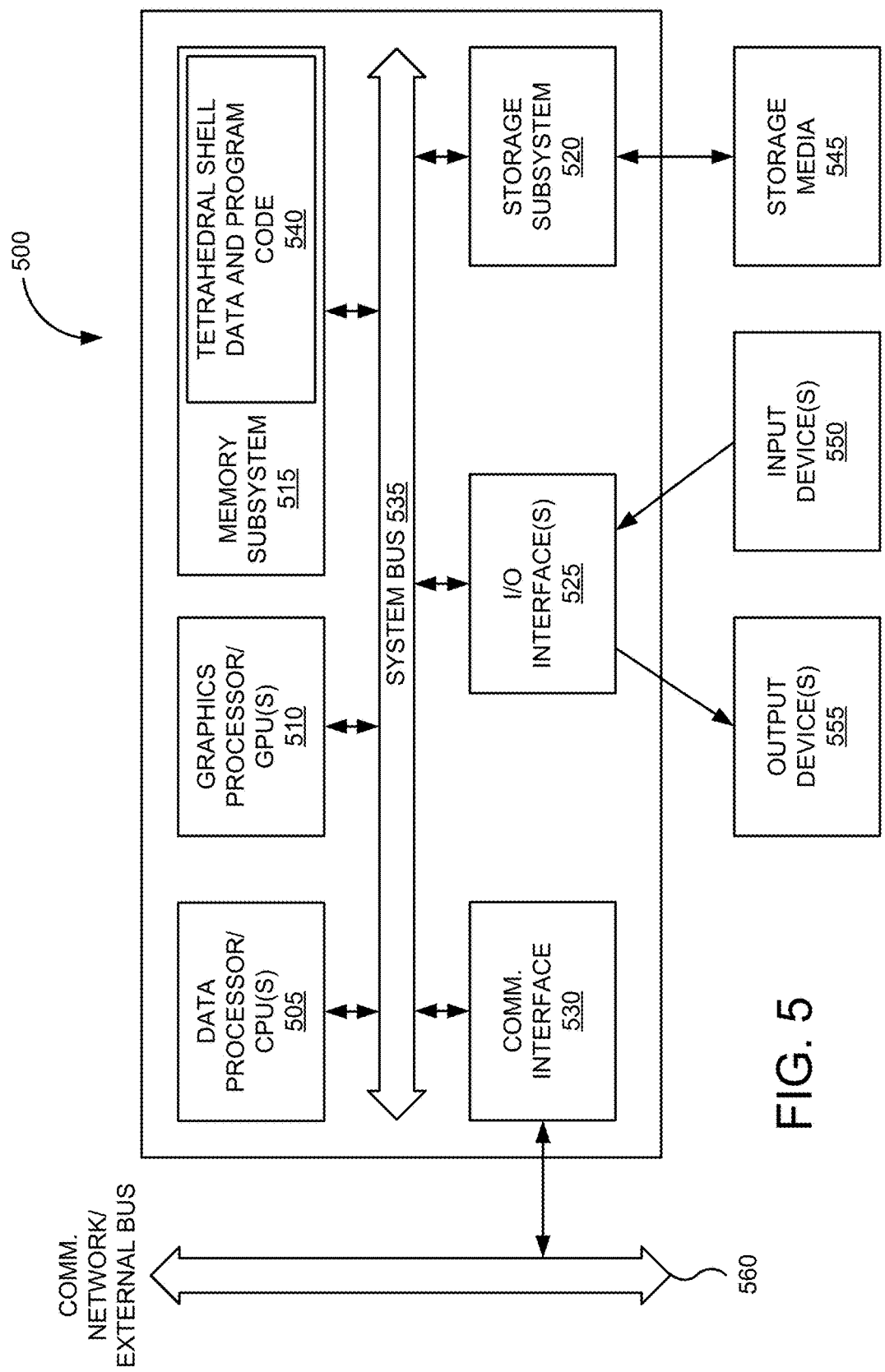
FIG. 5 is a block diagram of a computer system or information processing device that may incorporate an embodiment, be incorporated into an embodiment, or be used to practice any of the innovations, embodiments, and/or examples found within this disclosure.

FIG. 5 is a block diagram of computer system 500 that may incorporate an embodiment, be incorporated into an embodiment, or be used to practice any of the innovations, embodiments, and/or examples found within this disclosure. FIG. 5 is merely illustrative of a computing device, general-purpose computer system programmed according to one or more disclosed techniques, or specific information processing device for an embodiment incorporating an invention whose teachings may be presented herein and does not limit the scope of the invention as recited in the claims. One of ordinary skill in the art would recognize other variations, modifications, and alternatives.

Computer system 500 can include hardware and/or software elements configured for performing logic operations and calculations, input/output operations, machine communications, or the like. Computer system 500 may include familiar computer components, such as one or more one or more data processors or central processing units (CPUs) 505, one or more graphics processors or graphical processing units (GPUs) 510, memory subsystem 515, storage subsystem 520, one or more input/output (I/O) interfaces 525, communications interface 530, or the like. Computer system 500 can include system bus 535 interconnecting the above components and providing functionality, such connectivity and inter-device communication. Computer system 500 may be embodied as a computing device, such as a personal computer (PC), a workstation, a mini-computer, a mainframe, a cluster or farm of computing devices, a laptop, a notebook, a netbook, a PDA, a smartphone, a consumer electronic device, a gaming console, or the like.

The one or more data processors or central processing units (CPUs) 505 can include hardware and/or software elements configured for executing logic or program code or for providing application-specific functionality. Some examples of CPU(s) 505 can include one or more micro-processors (e.g., single core and multi-core) or micro-controllers. CPUs 505 may include 4-bit, 8-bit, 12-bit, 16-bit, 32-bit, 64-bit, or the like architectures with similar or divergent internal and external instruction and data designs. CPUs 505 may further include a single core or multiple cores. Commercially available processors may include those provided by Intel of Santa Clara, Calif. (e.g., x86, x86_64, PENTIUM, CELERON, CORE, CORE 2, CORE ix, ITANIUM, XEON, etc.), by Advanced Micro Devices of Sunnyvale, Calif. (e.g., x86, AMD_64, ATHLON, DURON, TURION, ATHLON XP/64, OPTERON, PHENOM, etc). Commercially available processors may further include those conforming to the Advanced RISC Machine (ARM) architecture (e.g., ARMv7-9), POWER and POWERPC architecture, CELL architecture, and or the like. CPU(s) 505 may also include one or more field-gate programmable arrays (FPGAs), application-specific integrated circuits (ASICs), or other microcontrollers. The one or more data processors or central processing units (CPUs) 505 may include any number of registers, logic units, arithmetic units, caches, memory interfaces, or the like. The one or more data processors or central processing units (CPUs) 505 may further be integrated, irremovably or moveably, into one or more motherboards or daughter boards.

The one or more graphics processor or graphical processing units (GPUs) 510 can include hardware and/or software elements configured for executing logic or program code associated with graphics or for providing graphics-specific functionality. GPUs 510 may include any conventional graphics processing unit, such as those provided by conventional video cards. Some examples of GPUs are commercially available from NVIDIA, ATI, and other vendors. In various embodiments, GPUs 510 may include one or more vector or parallel processing units. These GPUs may be user programmable, and include hardware elements for encoding/decoding specific types of data (e.g., video data) or for accelerating 2D or 3D drawing operations, texturing operations, shading operations, or the like. The one or more graphics processors or graphical processing units (GPUs) 510 may include any number of registers, logic units, arithmetic units, caches, memory interfaces, or the like. The one or more data processors or central processing units (CPUs) 505 may further be integrated, irremovably or moveably, into one or more motherboards or daughter boards that include dedicated video memories, frame buffers, or the like.

Memory subsystem 515 can include hardware and/or software elements configured for storing information. Memory subsystem 515 may store information using machine-readable articles, information storage devices, or computer-readable storage media. Some examples of these articles used by memory subsystem 570 can include random access memories (RAM), read-only-memories (ROMS), volatile memories, non-volatile memories, and other semiconductor memories. In various embodiments, memory subsystem 515 can include tetrahedral shell data and program code 540.

Storage subsystem 520 can include hardware and/or software elements configured for storing information. Storage subsystem 520 may store information using machine-readable articles, information storage devices, or computer-readable storage media. Storage subsystem 520 may store information using storage media 545. Some examples of storage media 545 used by storage subsystem 520 can include floppy disks, hard disks, optical storage media such as CD-ROMs, DVDs and bar codes, removable storage devices, networked storage devices, or the like. In some embodiments, all or part of tetrahedral shell data and program code 540 may be stored using storage subsystem 520.

In various embodiments, computer system 500 may include one or more hypervisors or operating systems, such as WINDOWS, WINDOWS NT, WINDOWS XP, VISTA, WINDOWS 7 or the like from Microsoft of Redmond, Wash., Mac OS or Mac OS X from Apple Inc. of Cupertino, Calif., SOLARIS from Sun Microsystems, LINUX, UNIX, and other UNIX-based or UNIX-like operating systems. Computer system 500 may also include one or more applications configured to execute, perform, or otherwise implement techniques disclosed herein. These applications may be embodied as tetrahedral shell data and program code 540. Additionally, computer programs, executable computer code, human-readable source code, shader code, rendering engines, or the like, and data, such as image files, models including geometrical descriptions of objects, ordered geometric descriptions of objects, procedural descriptions of models, scene descriptor files, or the like, may be stored in memory subsystem 515 and/or storage subsystem 520.

The one or more input/output (I/O) interfaces 525 can include hardware and/or software elements configured for performing I/O operations. One or more input devices 550 and/or one or more output devices 555 may be communicatively coupled to the one or more I/O interfaces 525.

The one or more input devices 550 can include hardware and/or software elements configured for receiving information from one or more sources for computer system 500. Some examples of the one or more input devices 550 may include a computer mouse, a trackball, a track pad, a joystick, a wireless remote, a drawing tablet, a voice command system, an eye tracking system, external storage systems, a monitor appropriately configured as a touch screen, a communications interface appropriately configured as a transceiver, or the like. In various embodiments, the one or more input devices 550 may allow a user of computer system 500 to interact with one or more non-graphical or graphical user interfaces to enter a comment, select objects, icons, text, user interface widgets, or other user interface elements that appear on a monitor/display device via a command, a click of a button, or the like.

The one or more output devices 555 can include hardware and/or software elements configured for outputting information to one or more destinations for computer system 500. Some examples of the one or more output devices 555 can include a printer, a fax, a feedback device for a mouse or joystick, external storage systems, a monitor or other display device, a communications interface appropriately configured as a transceiver, or the like. The one or more output devices 555 may allow a user of computer system 500 to view objects, icons, text, user interface widgets, or other user interface elements.

A display device or monitor may be used with computer system 500 and can include hardware and/or software elements configured for displaying information. Some examples include familiar display devices, such as a television monitor, a cathode ray tube (CRT), a liquid crystal display (LCD), or the like.

Communications interface 530 can include hardware and/or software elements configured for performing communications operations, including sending and receiving data. Some examples of communications interface 530 may include a network communications interface, an external bus interface, an Ethernet card, a modem (telephone, satellite, cable, ISDN), (asynchronous) digital subscriber line (DSL) unit, FireWire interface, USB interface, or the like. For example, communications interface 530 may be coupled to communications network/external bus 580, such as a computer network, to a FireWire bus, a USB hub, or the like. In other embodiments, communications interface 530 may be physically integrated as hardware on a motherboard or daughter board of computer system 500, may be implemented as a software program, or the like, or may be implemented as a combination thereof In various embodiments, computer system 500 may include software that enables communications over a network, such as a local area network or the Internet, using one or more communications protocols, such as the HTTP, TCP/IP, RTP/RTSP protocols, or the like. In some embodiments, other communications software and/or transfer protocols may also be used, for example IPX, UDP or the like, for communicating with hosts over the network or with a device directly connected to computer system 500.

As suggested, FIG. 5 is merely representative of a general-purpose computer system appropriately configured or specific data processing device capable of implementing or incorporating various embodiments of an invention presented within this disclosure. Many other hardware and/or software configurations may be apparent to the skilled artisan which are suitable for use in implementing an invention presented within this disclosure or with various embodiments of an invention presented within this disclosure. For example, a computer system or data processing device may include desktop, portable, rack-mounted, or tablet configurations. Additionally, a computer system or information processing device may include a series of networked computers or clusters/grids of parallel processing devices. In still other embodiments, a computer system or information processing device may perform techniques described above as implemented upon a chip or an auxiliary processing board.

Various embodiments of any one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A method for generating a plurality of tetrahedrons from a plurality of prisms, the method comprising:
    receiving, at one or more computer systems, information specifying a first surface of triangles that are connected;
    receiving, at the one or more computer systems, information specifying a second surface of triangles having a same connectivity as the first surface, wherein pairs of corresponding triangles of the first surface and the second surface form a prism, each prism comprising three quadrilateral surfaces;
    for each prism, splitting, by the one or more computer systems, the prism into three tetrahedrons by forming a diagonal edge on each of the three quadrilateral surfaces such that:
        each of the diagonal edges is associated with a direction from an origin vertex to a destination vertex on the quadrilateral surface, and
        each of the three tetrahedrons comprises two of the diagonal edges; and
    for each diagonal edge of each prism:
        determining the direction of the diagonal edge to be formed by comparing the origin vertex and the destination vertex such that the diagonal edge is determined to be formed as a rising edge when an index value of the origin vertex of the diagonal edge is less than an index value of the destination vertex of the diagonal edge; and, wherein
    the two diagonal edges of any of the three tetrahedrons of any of the plurality of the prisms are not both rising edges.

2. The method of claim 1, further comprising:
    for each diagonal edge of each prism:
    determining the direction of the diagonal edge as a falling edge when the index value of the origin vertex of the diagonal edge is greater than the index value of the destination vertex of the diagonal edge, and wherein the two diagonal edges of any of the three tetrahedrons of any of the plurality of the prisms are not both falling edges.

3. The method of claim 1, wherein forming the diagonal edges on the quadrilateral surfaces of the prism comprises:
    forming a first diagonal edge from a origin vertex to a destination vertex on a first quadrilateral surface and forming a second diagonal edge from a origin vertex to a destination vertex on a second quadrilateral surface, wherein the destination vertex on the first quadrilateral surface for the first diagonal edge and the origin vertex on the second quadrilateral surface for the second diagonal edge are the same vertex on the prism.

4. The method of claim 1, wherein the plurality of prisms include a first prism and a second prism that share a common quadrilateral surface, and wherein forming the diagonal edges on the common quadrilateral surface for the first and second prisms comprises:
forming a rising edge on the common quadrilateral surface for the first prism and forming a falling edge on the common quadrilateral surface for the second prism.

5. The method of claim 1, wherein forming the diagonal edges on the prisms comprises connecting opposite vertices on the quadrilateral surfaces such that the diagonal edges are not all rising edges, and are not all falling edges.

6. The method of claim 1, further comprising:
for each of the prism:
classifying, by the one or more computer systems, a set of vertices on the prism into at least partial ordering based on the index values of vertices, and wherein the comparison of the origin vertex and destination vertex is based on the partial ordering.

7. The method of claim 1, wherein the index values of the origin vertex and destination vertex include x-coordinate values.

8. A non-transitory computer-readable medium storing computer-executable code for generating an offset volume, the non-transitory computer-readable medium comprising:
code for receiving information specifying a first surface of triangles that are connected;
code for receiving information specifying a second surface of triangles having a same connectivity as the first surface, wherein pairs of corresponding triangles of the first surface and the second surface form a prism, each prism comprising three quadrilateral surfaces;
code for splitting, for each prism, the prism into three tetrahedrons by forming a diagonal edge on each of the three quadrilateral surfaces such that:
each of the diagonal edges is associated with a direction from an origin vertex to a destination vertex on the quadrilateral surface, and
each of the three tetrahedrons comprises two of the diagonal edges; and
for each diagonal edge of each prism:
determining the direction of the diagonal edge to be formed by comparing the origin vertex and the destination vertex such that the diagonal edge is determined to be formed as a rising edge when an index value of the origin vertex of the diagonal edge is less than an index value of the destination vertex of the diagonal edge; and, wherein
the two diagonal edges of any of the three tetrahedrons of any of the plurality of the prisms are not both rising edges.

9. The non-transitory computer-readable medium of claim 8, further comprising code for:
for each diagonal edge of each prism:
determining the direction of the diagonal edge as a falling edge when the coordinate value of the index vertex of the diagonal edge is greater than the index value of the destination vertex of the diagonal edge, and wherein the two diagonal edges of any of the three tetrahedrons of any of the plurality of the prisms are not both falling edges.

10. The non-transitory computer-readable medium of claim 8, wherein forming the diagonal edges on the quadrilateral surfaces of the prism comprises:
forming a first diagonal edge from a origin vertex to a destination vertex on a first quadrilateral surface and forming a second diagonal edge from a origin vertex to a destination vertex on a second quadrilateral surface, wherein the destination vertex on the first quadrilateral surface for the first diagonal edge and the origin vertex on the second quadrilateral surface for the second diagonal edge are the same vertex on the prism.

11. The non-transitory computer-readable medium of claim 8, wherein the plurality of prisms include a first prism and a second prism that share a common quadrilateral surface, and wherein forming the diagonal edges on the common quadrilateral surface for the first and second prisms comprises:
forming a rising edge on the common quadrilateral surface for the first prism and forming a falling edge on the common quadrilateral surface for the second prism.

12. The non-transitory computer-readable medium of claim 8, wherein forming the diagonal edges on the prisms comprises connecting opposite vertices on the quadrilateral surfaces such that the diagonal edges are not all rising edges, and are not all falling edges.

13. The non-transitory computer-readable medium of claim 8, further comprising code for:
for each of the prism:
classifying a set of vertices on the prism into at least partial ordering based on the index values of vertices, and wherein the comparison of the origin vertex and destination vertex is based on the partial ordering.

14. The non-transitory computer-readable medium method of claim 8, wherein the index values of the origin vertex and destination vertex are x-coordinate values.

15. A system for generating a plurality of tetrahedrons from a plurality of prisms, the system comprising:
a processor; and
a memory configured to store a set of instructions which when executed by the processor cause the processor to:
receive information specifying a first surface of triangles that are connected;
receive information specifying a second surface of triangles having a same connectivity as the first surface, wherein pairs of corresponding triangles of the first surface and the second surface form a prism, each prism comprising three quadrilateral surfaces;
for each prism, split, by the one or more computer systems, the prism into three tetrahedrons by forming a diagonal edge on each of the three quadrilateral surfaces such that:
each of the diagonal edges is associated with a direction from an origin vertex to a destination vertex on the quadrilateral surface, and
each of the three tetrahedrons comprises two of the diagonal edges; and
for each diagonal edge of each prism:
determine the direction of the diagonal edge to be formed by comparing the origin vertex and the destination vertex such that the diagonal edge is determined to be formed as a rising edge when an index value of the origin vertex of the diagonal edge is less than an index value of the destination vertex of the diagonal edge; and, wherein
the two diagonal edges of any of the three tetrahedrons of any of the plurality of the prisms are not both rising edges.

16. The system of claim 15, wherein the set of instructions when executed by the processor cause the processor further to:

for each diagonal edge of each prism:
determine the direction of the diagonal edge as a falling edge when the index value of the origin vertex of the diagonal edge is greater than the index value of the destination vertex of the diagonal edge, and wherein the two diagonal edges of any of the three tetrahedrons of any of the plurality of the prisms are not both falling edges.

17. The system of claim 15, wherein forming the diagonal edges on the quadrilateral surfaces of the prism comprises:

forming a first diagonal edge from a origin vertex to a destination vertex on a first quadrilateral surface and forming a second diagonal edge from a origin vertex to a destination vertex on a second quadrilateral surface, wherein the destination vertex on the first quadrilateral surface for the first diagonal edge and the origin vertex on the second quadrilateral surface for the second diagonal edge are the same vertex on the prism.

18. The system of claim 15, the plurality of prisms include a first prism and a second prism that share a common quadrilateral surface, and wherein forming the diagonal edges on the common quadrilateral surface for the first and second prisms comprises:

forming a rising edge on the common quadrilateral surface for the first prism and forming a falling edge on the common quadrilateral surface for the second prism.

19. The system of claim 15, wherein forming the diagonal edges on the prism comprises connecting opposite vertices on the quadrilateral surfaces such that the diagonal edges are not all rising edges, and are not all falling edges.

20. The system of claim 15, wherein the set of instructions, when executed by the processor, cause the processor to further to:

for each of the prism:
classify a set of vertices on the prism into at least partial ordering based on the index values of vertices, and wherein the comparison of the origin vertex and destination vertex is based on the partial ordering.

21. The system of claim 15, wherein the coordinate values of the origin vertex and destination vertex are x-coordinate values.

* * * * *